United States Patent
Schauer et al.

(10) Patent No.: US 7,750,709 B1
(45) Date of Patent: Jul. 6, 2010

(54) METHOD AND APPARATUS FOR BIASING A FLOATING NODE IN AN INTEGRATED CIRCUIT

(75) Inventors: Justin M. Schauer, San Francisco, CA (US); Robert D. Hopkins, Hayward, CA (US)

(73) Assignee: Oracle America, Inc., Redwood Shores, CA (US)

(*) Notice: Subject to any disclaimer, the term of this patent is extended or adjusted under 35 U.S.C. 154(b) by 33 days.

(21) Appl. No.: 11/651,221

(22) Filed: Jan. 5, 2007

Related U.S. Application Data (60) Provisional application No. 60/756,789, filed on Jan. 6, 2006.

(51) Int. Cl.
*H03H 11/26* (2006.01)

(52) U.S. Cl. ............. 327/264; 327/261; 327/268; 327/276; 327/277; 327/278; 438/141; 438/142

(58) Field of Classification Search ............... 327/261, 327/264, 268
See application file for complete search history.

(56) References Cited

U.S. PATENT DOCUMENTS

| | | | |
|---|---|---|---|
| 6,459,312 B2 * | 10/2002 | Ogawa et al. | 327/153 |
| 7,142,031 B2 * | 11/2006 | Okayasu et al. | 327/277 |
| 7,292,079 B2 * | 11/2007 | Huang et al. | 327/158 |

* cited by examiner

*Primary Examiner*—Lincoln Donovan
*Assistant Examiner*—John W Poos
(74) *Attorney, Agent, or Firm*—Park, Vaughan & Fleming LLP (57) ABSTRACT

One embodiment of the present invention provides a system that biases a floating node within an integrated circuit. During operation, the system first identifies the floating node within the integrated circuit to be biased. The system then determines a desired bias voltage. Next, the system couples a low-power bias source to the floating node to supply the desired bias voltage, wherein the floating node is biased without stopping data transmission through the floating node during biasing.

9 Claims, 6 Drawing Sheets

METHOD AND APPARATUS FOR BIASING A FLOATING NODE IN AN INTEGRATED CIRCUIT

RELATED APPLICATION

This application hereby claims priority under 35 U.S.C. §119 to U.S. Provisional Patent Application No. 60/756,789, filed on 6 Jan. 2006, entitled "Biasing Floating Nodes with a Leaky Transistor," by the same inventors as the instant application.

GOVERNMENT LICENSE RIGHTS

This invention was made with United States Government support under Contract No. NBCH3039002 awarded by the Defense Advanced Research Projects Administration. The United States Government has certain rights in the invention.

BACKGROUND

1. Field of the Invention

The present invention relates to biasing techniques in integrated circuit (IC) chips. More specifically, the present invention relates to a method and an apparatus for biasing a floating node in a system that supports proximity communication.

2. Related Art

Advances in semiconductor technology presently make it possible to integrate large-scale systems, including hundreds of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

However, these semiconductor chips still need to communicate with each other, and unfortunately, these advances in semiconductor technology have not been matched by corresponding advances in inter-chip communication technology. Semiconductor chips are typically integrated onto a printed circuit board that contains multiple layers of signal lines for inter-chip communication. However, signal lines are typically 100 to 1000 times denser on a semiconductor chip than on a printed circuit board. Consequently, only a tiny fraction of the signal lines on a semiconductor chip can be routed across the printed circuit board to other chips. This problem is creating a bottleneck that is expected to worsen as semiconductor integration densities continue to increase.

One solution to the above problem is to replace the direct conductive coupling with direct chip-to-chip capacitive coupling, referred to as "Proximity Communication." Proximity communication involves integrating arrays of capacitive transmitters and receivers onto semiconductor chips to facilitate inter-chip communication. If a first chip is situated face-to-face with a second chip so that transmitter pads on the first chip are capacitively coupled via a coupling capacitor with receiver pads on the second chip, it becomes possible to transmit electrical signals directly from the first chip to the second chip without having to route the electrical signal through intervening signal lines within a printed circuit board.

However, a capacitively coupled communication channel blocks the transmission of a DC component in the electrical signal. Moreover, the input node of the receiver amplifier, which is coupled to the receiver pad of the coupling capacitor, may not have a well-defined bias voltage, and is often floating. Consequently, in order to extract the DC level in the transmitted signal and to properly recover the transmitted information, the floating node which is coupled to the input of the receiver is typically biased to an appropriate DC voltage with external biasing circuits. This DC voltage sets a suitable DC operating point for the input of the receiver.

A number of biasing techniques have been proposed to set the DC bias voltage to a floating node. One existing technique refreshes the receiver inputs by periodically precharging/postcharging the receiving wires to a predetermined bias voltage. However, this technique can cause substantial power consumption. Moreover, attempts to make the periodical refreshing less frequent to reduce power consumption can cause further complexity in the biasing control mechanism.

Another existing biasing technique refreshes inputs by occasionally stopping the transmission of data across the coupling channels when necessary. Unfortunately, the process of stopping and resuming data communication can take a substantial amount of time. Furthermore, hiding the resulting delay can add additional design complexity.

Yet another existing biasing technique uses negative feedback from the output of a receiver to bias the input wire of the receiver. However, this technique adds complexity to the design and consumes a large amount of power.

Hence, what is needed is a method and an apparatus for biasing such floating nodes without the above-described problems.

SUMMARY

One embodiment of the present invention provides a system that biases a floating node within an integrated circuit. During operation, the system first identifies the floating node within the integrated circuit to be biased. The system then determines a desired bias voltage. Next, the system couples a low-power bias source to the floating node to supply the desired bias voltage, wherein the floating node is biased without stopping data transmission through the floating node during biasing.

In a variation on this embodiment, the low-power bias source comprises a biasing transistor which includes four terminals.

In a further variation on this embodiment, the biasing transistor can include an NMOS biasing transistor and a PMOS biasing transistor.

In a further variation on this embodiment, the system couples the low-power bias source to the floating node to supply the desired bias voltage by: (1) selecting one or more of the four terminals of the biasing transistor as the output terminal; (2) connecting the remaining unselected terminals to the desired bias voltage; (3) coupling the output terminal of the biasing transistor to the floating node; and (4) allowing a leakage current within the biasing transistor to gradually bias the floating node to the desired bias voltage, wherein the leakage current is between the selected terminals and the unselected terminals. In this embodiment, the leakage current is substantially smaller than a normal conducting current, thereby facilitating a low-power biasing operation.

In a further variation, the selected terminals can be: the drain of the transistor; the source of the transistor; the gate of the transistor; or the body of the transistor.

In a further variation, the leakage current can be a drain-source leakage current; a gate leakage current; or a body leakage current.

In a further variation, the system controls a time constant associated with gradually biasing the floating node to the desired bias voltage by changing the sizing of the biasing transistor.

In a variation on this embodiment, the floating node can include a capacitive node or an inductive node.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Floating Nodes in Nonconductively-Coupled Communication Channels

Figure 1A:
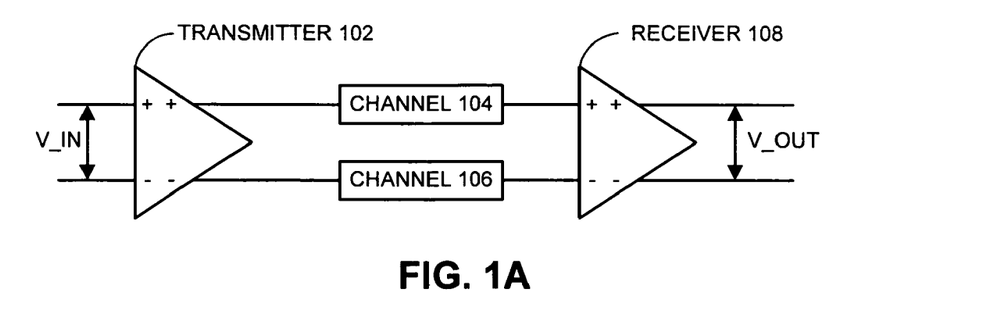
FIG. 1A illustrates a differential communication channel that facilitates data communication between a transmitter and a receiver in accordance with an embodiment of the present invention.

FIG. 1A illustrates a differential communication channel that facilitates data communication between a transmitter and a receiver in accordance with an embodiment of the present invention. This differential communication channel includes a transmitter 102, coupling channels 104 and 106, and a receiver 108. Transmitter 102 is a differential output amplifier, which produces a signal to be transmitted differentially on the pair of coupling channels 104 and 106, and received at the inputs of differential receiver 108. The received differential signal is amplified by differential receiver 108 to obtain the desired signal level and signal-to-noise ratio.

Figure 1B:
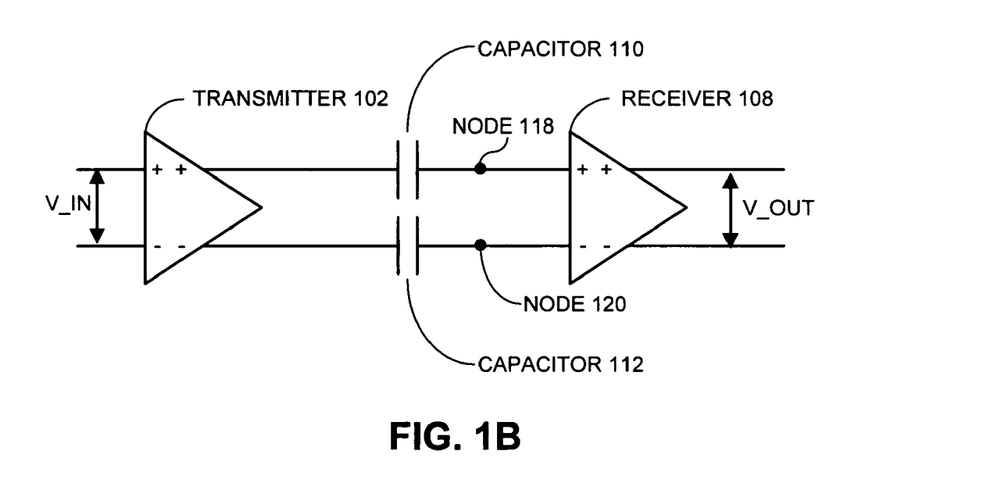
FIG. 1B illustrates the differential communication channel of FIG. 1A wherein the coupling channels are implemented by using coupling capacitors in accordance with an embodiment of the present invention.

FIG. 1B illustrates the differential communication channel of FIG. 1A wherein the coupling channels are implemented by using coupling capacitors in accordance with an embodiment of the present invention. As seen in FIG. 1B, coupling channels 104 and 106 are implemented using coupling capacitors 110 and 112, respectively. Each coupling capacitor couples an electrical signal corresponding to the data signal from transmitter 102 to receiver 108. In the context of proximity communication, the transmitter side electrodes of the coupling capacitors correspond to transmitter pads, while the receiver side electrodes of the coupling capacitors correspond to receiver pads.

Figure 1C:
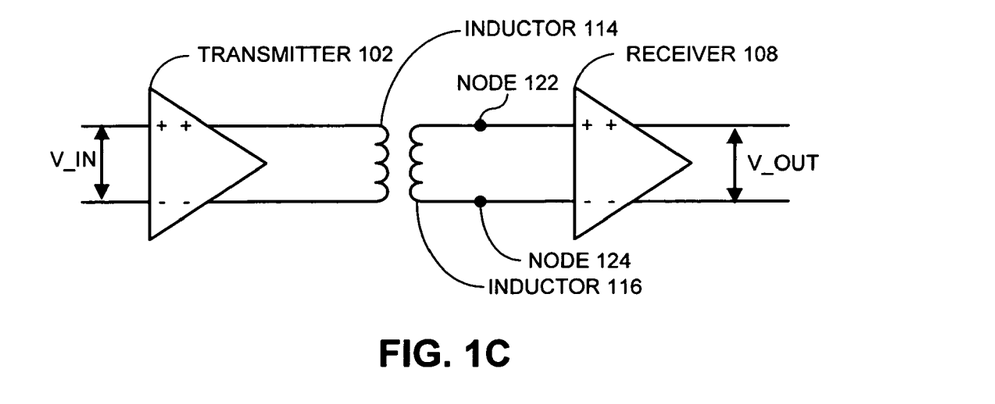
FIG. 1C illustrates the differential communication channel of FIG. 1A wherein the coupling channels are implemented by using coupling inductors in accordance with an embodiment of the present invention.

FIG. 1C illustrates the differential communication channel of FIG. 1A wherein the coupling channels are implemented by using coupling inductors in accordance with an embodiment of the present invention. As seen in FIG. 1C, coupling channels 104 and 106 are replaced with coupling inductors 114 and 116. Each coupling inductor couples an electrical signal corresponding to the data signal from transmitter 102 to receiver 108.

Note that because the input impedances of differential amplifier 108 are very high, capacitive input nodes 118 and 120 in FIG. 1B and inductive input nodes 122 and 124 in FIG. 1C have no conductive discharge paths. Hence, these input nodes are effectively "floating nodes", which do not have well-defined voltage values.

We describe low-power biasing techniques for such floating nodes in the context of a capacitively-coupled floating node. The same techniques may be used to bias any types of floating node, including an inductively-coupled floating node.

Biasing a Floating Nodes Using a Leakage Current

One embodiment of the present invention uses a complementary Metal Oxide semiconductor (CMOS) transistor in CUTOFF mode to bias a floating node, wherein the biasing transistor can be either a NMOS transistor or a PMOS transistor.

Note that a typical MOS transistor is a four-terminal device comprising a source, a drain, a gate, and a body which connects to substrate. Furthermore, the source and the drain and are commonly symmetrically fabricated and hence can exchange roles according to the applied voltages at these terminals.

Figure 2A:
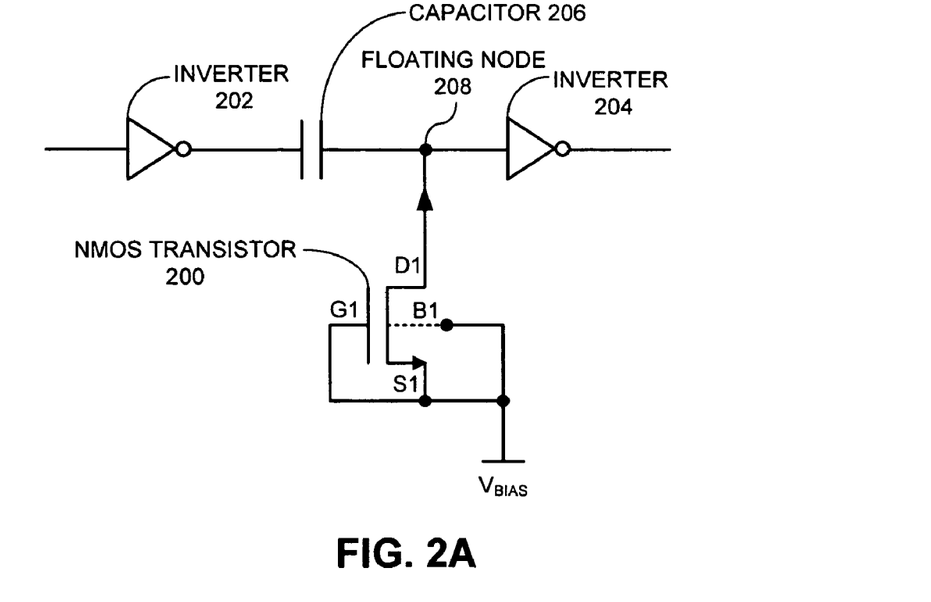
FIG. 2A illustrates a low-power biasing technique for a floating node using an NMOS transistor with a drain output in accordance with an embodiment of the present invention.

FIG. 2A illustrates a low-power biasing technique for a floating node using an NMOS transistor 200 with a drain output in accordance with an embodiment of the present invention. FIG. 2A includes a transmitter circuit (a simple inverter 202) that produces a data signal which is coupled to a receiver circuit (i.e., a simple inverter 204) through coupling capacitor 206. A floating node 208 at the input of inverter 204 is biased by a specially configured NMOS transistor 200.

In this embodiment, the source (S1), gate (G1), and body (B1) of NMOS transistor 200 are tied together and connected to a common voltage $V_{com}$. In one embodiment of the present invention, $V_{com}$ is the desired bias voltage $V_{bias}$. Meanwhile, the drain (D1) of NMOS transistor 200 is selected as the output terminal of the biasing transistor and is coupled to floating node 208.

Note that ideally, when the gate voltage and source voltage of a MOS transistor are identical, the transistor will be OFF, or not conducting. In actual systems, however, there almost always exist nonnegligible leakage currents within a MOS transistor which can flow between a pair of the terminals if there is a voltage difference across them.

Referring back to FIG. 2A, note that because G1, S1, and B1 are tied to the same voltage $V_{bias}$, the only leakage current in transistor 200 is between drain D1, which coupled to floating point 208, and the voltage source connecting the other three terminals. After the output terminal D1 is coupled to floating node 208, this leakage current will gradually "charge" the floating node towards $V_{bias}$. The time constant of the leakage current charging process can be controlled, for example by changing the width or length of biasing transistor 200. Note that this leakage current is typically much smaller than a typically conducting current when the transistor is ON, which ensures the biasing process to be a low-power operation.

Note that once the desired bias voltage is set up at a floating node, this bias voltage can drift from the ideal $V_{bias}$ due to a number of factors. One factor is that there can exist a tiny leakage current from the floating node into the receiver amplifier. Another source of drift comes from noise coupled onto the receiver line through coupling capacitor 206. However, when the bias voltage at floating node 208 drifts away, leakage currents from D1 to other terminals will be automatically established, and will hence correct the drift voltage towards $V_{bias}$. Note that this drift correction process is automatic and can continuously set the bias voltage towards the desired set point. The nature of self-recovering and self-maintaining of this bias technique allows the floating node to be biased without stopping data transmission through the floating node during biasing. Furthermore, the self-recovering property of the biasing technique can avoid the complex refreshing process which is required in the prior art techniques.

In another embodiment of the present invention, terminals G1, S1, and B1 may be connected to constant voltages V1, V2, and V3, respectively, wherein V1, V2, and V3 may or may not be equal to one another. In this case, leakage currents between D1 and G1, S1, and B1 can also slowly bias D1 to a certain combination of the gate/source/body voltages.

In another embodiment of the present invention, instead of selecting only one terminal, any combination of two or three terminals may be selected from the four terminals as output terminals which are then coupled to the floating node to supply the bias voltage. The remaining unselected terminals are tied together and connected to the desired bias voltage in the same manner as described-above.

Figure 2B:
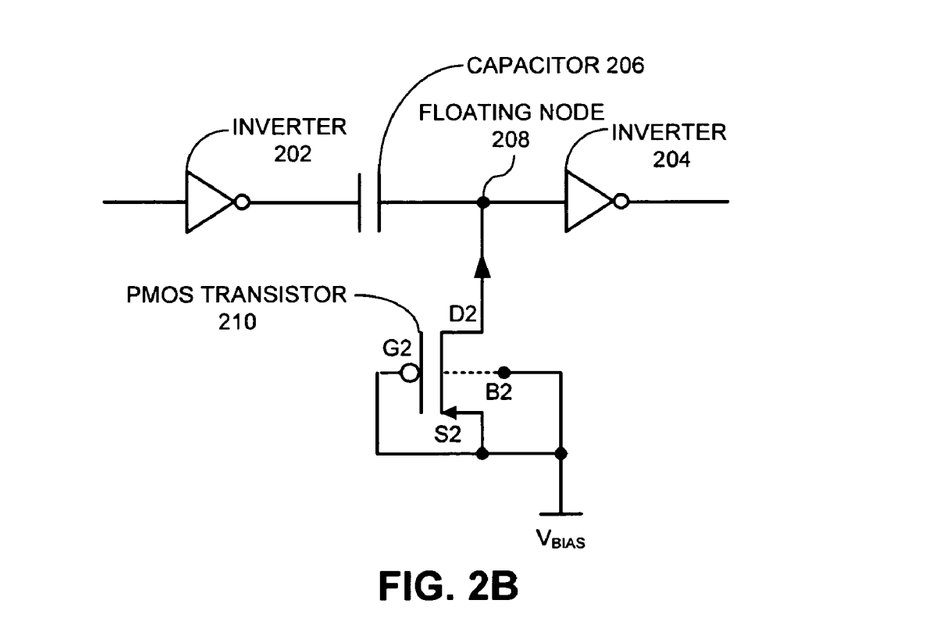
FIG. 2B illustrates a low-power biasing technique for a floating node using a PMOS transistor with a drain output in accordance with an embodiment of the present invention.

FIG. 2B illustrates a low-power biasing technique for a floating node using a PMOS transistor 210 with a drain output in accordance with an embodiment of the present invention. FIG. 2B comprises essentially the same communication channel as FIG. 2A. However, floating node 208 at the input of inverter 204 is now biased by a specifically configured PMOS transistor 210. Specifically, the source (S2), gate (G2), and body (B2) of PMOS transistor 210 are tied together and connected to a common voltage $V_{com}$. In one embodiment of the present invention, this common voltage is the desired bias voltage $V_{bias}$. Meanwhile, the drain (D2) of PMOS transistor 210 is selected as the output terminal of the biasing transistor and is coupled to floating node 208. Similar to the process of setting up the biasing voltage in FIG. 2A, a leakage current in PMOS transistor 210 is responsible for gradually charging up floating node 208 to the desired bias voltage in a low-power process.

Note that the choice of which type of transistors to use as the biasing transistor can depend on the desired bias voltage. In one embodiment, if the desired bias voltage is a low voltage, for example, a GND voltage, the low-power bias source is preferably derived from an NMOS transistor. On the other hand, if the bias voltage is a high voltage, for example the supply voltage VDD, the low-power bias source is preferably derived from a PMOS transistor.

Note that although NMOS transistors are preferably used when the common voltage is substantially near the ground voltage, PMOS transistors can still be used if their gates are driven to a sufficiently low voltage. Similarly, note that although PMOS transistors are preferably used when the common voltage is substantially near a high voltage such as VDD, NMOS transistors can still be used if their gates are driven to a sufficiently high voltage. Generally, both the NMOS and the PMOS transistors can be used to derive a desired bias voltage anywhere between GND and VDD. In one embodiment of the present invention, the desired bias voltage is set to equal to the average of the high and low voltages being sent across coupling capacitor 206.

Other Variations

FIGS. 2A and 2B illustrate a configuration of a low-power biasing source, which uses a drain as the output terminal while tying the other three terminals to the desired bias voltage. However, the output terminal can alternatively be each of the other three transistor terminals as well: the source, gate or body.

Figure 3A:
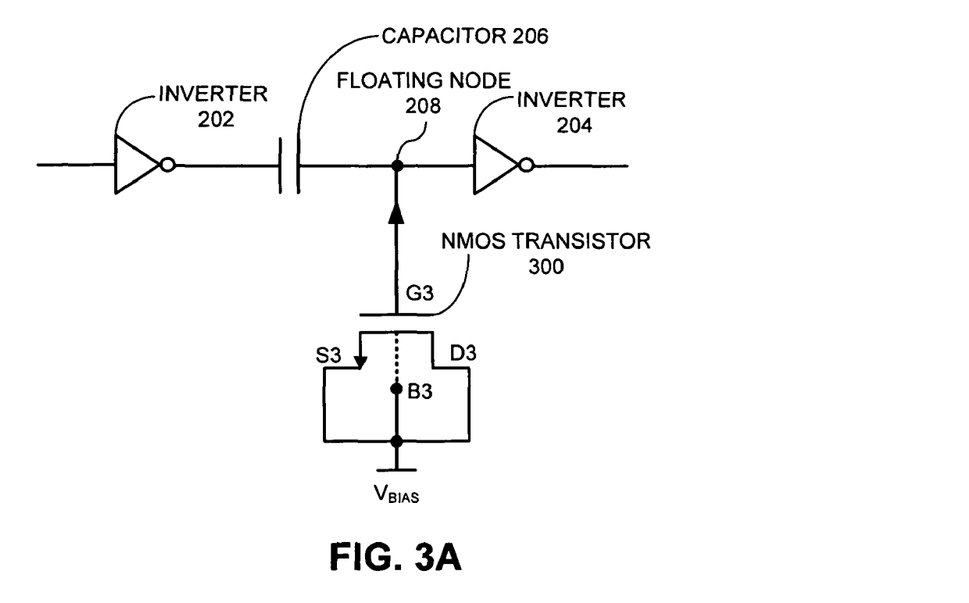
FIG. 3A illustrates a low-power biasing technique for a floating node using an NMOS transistor with a gate output in accordance with an embodiment of the present invention.

FIG. 3A illustrates a low-power biasing technique for a floating node using an NMOS transistor 300 with a gate output in accordance with an embodiment of the present invention.

In this embodiment, the output terminal which is coupled to floating point 208 is gate G3. The remaining three terminals S3, D3, and B3 are tied together and connected to the desired bias voltage as before. Note that in this biasing scheme, a gate leakage current is responsible for slowly charging the floating node to the desired bias voltage in a low-power operation.

Figure 3B:
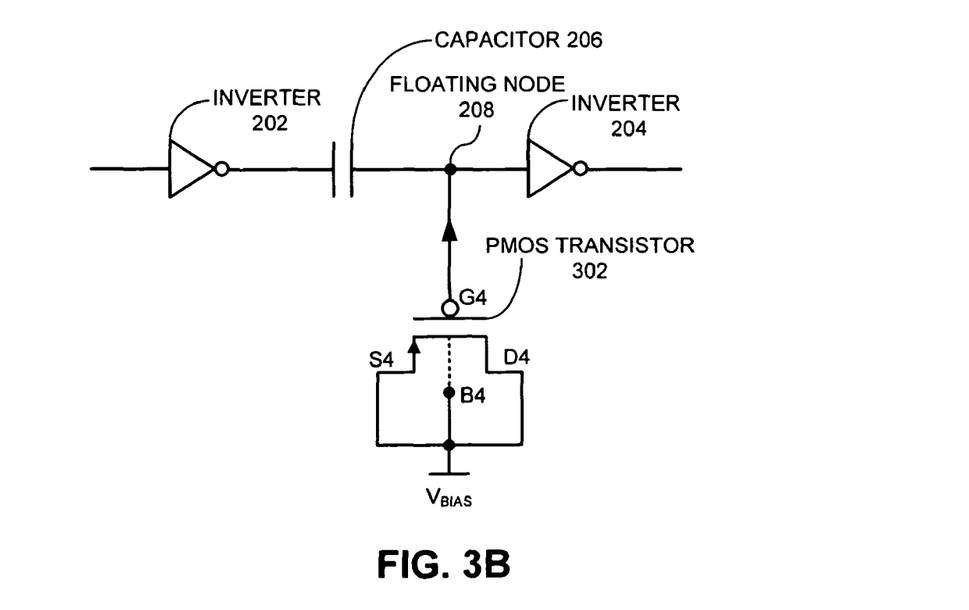
FIG. 3B illustrates a low-power biasing technique for a floating node using a PMOS transistor with a gate output in accordance with an embodiment of the present invention.

FIG. 3B illustrates a low-power biasing technique for a floating node using a PMOS transistor 302 with a gate output in accordance with an embodiment of the present invention.

In this embodiment, the output terminal, which is coupled to floating point 208, is gate G4. The remaining three terminals S4, D4, and B4 are tied together and connected to the desired bias voltage as before.

Figure 4A:
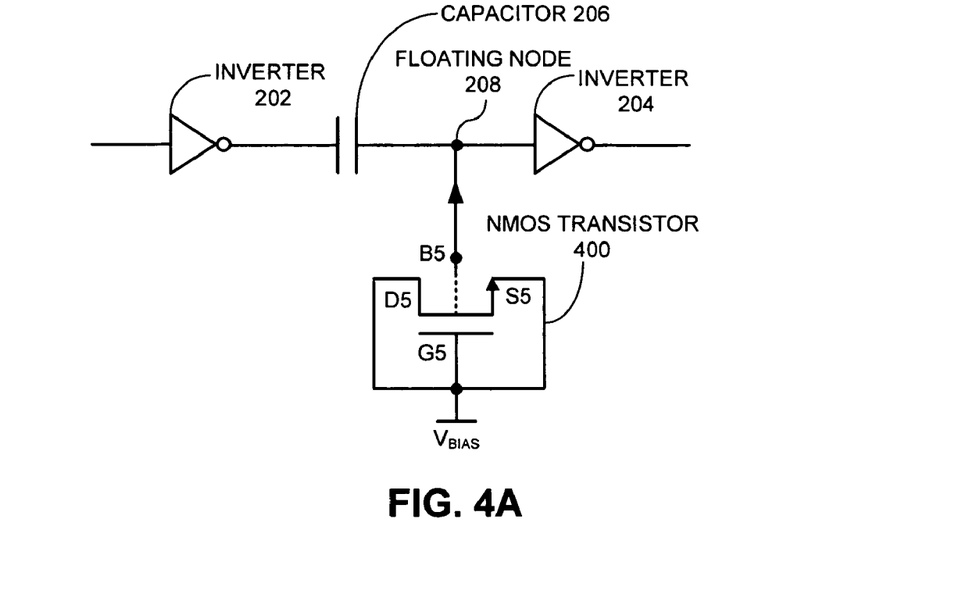
FIG. 4A illustrates a low-power biasing technique for a floating node using an NMOS transistor with a body output in accordance with an embodiment of the present invention.

FIG. 4A illustrates a low-power biasing technique for a floating node using an NMOS transistor 400 with a body output in accordance with an embodiment of the present invention.

In this embodiment, the output terminal which is coupled to floating point 208 is body B5. The remaining three terminals S5, D5, and G3 are tied together and connected to the desired bias voltage as before. Note that in this biasing scheme, a body leakage current is responsible for slowly charging the floating node to the desired bias voltage in a low-power operation.

Figure 4B:
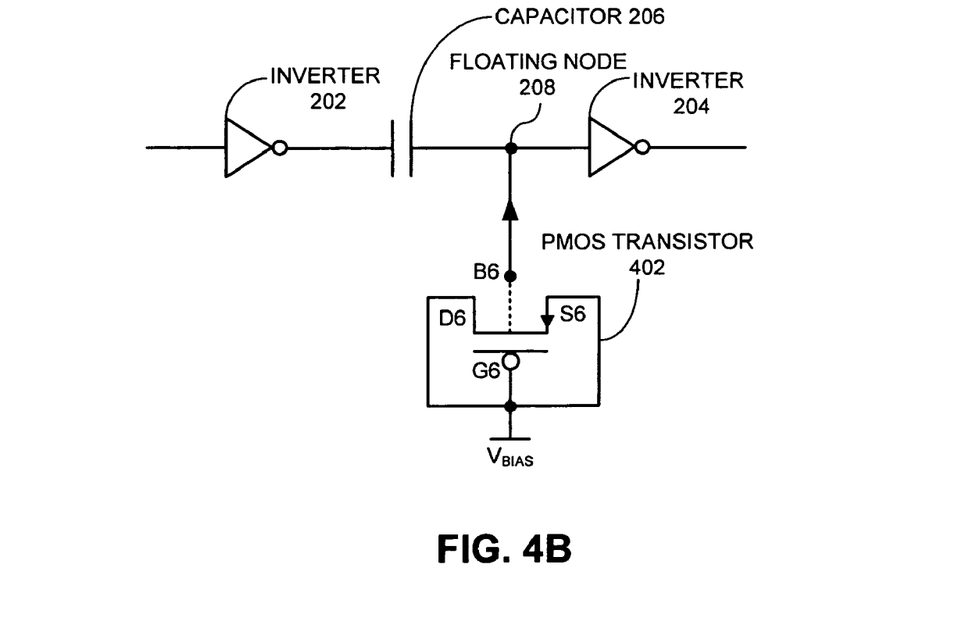
FIG. 4B illustrates a low-power biasing technique for a floating node using a PMOS transistor 402 with a body output in accordance with an embodiment of the present invention.

FIG. 4B illustrates a low-power biasing technique for a floating node using a PMOS transistor 402 with a body output in accordance with an embodiment of the present invention.

In this embodiment, the output terminal which is coupled to floating point 208 is body B6. The remaining three terminals S6, D6, and G6 are tied together and connected to the desired bias voltage as before.

Note that because the source and drain are symmetrically constructed in MOS transistors, the variation of using a source output is identical to that of the drain output described in FIGS. 2A and 2B.

Note that although we have illustrated in FIGS. 2-4 as having just one selected terminal as output terminal, the number of terminals that can be selected as output terminals can alternatively be any combination of two or three of the four terminals, wherein the remaining unselected terminals are connected to the desired bias voltage.

Also note that although we have described the low-power bias source as a MOS transistor with leakage current, other types of transistors may also be used if it has an inherent leakage current and a high impedance while being biased in an OFF mode.

The Process of Biasing a Floating Node

Figure 5:
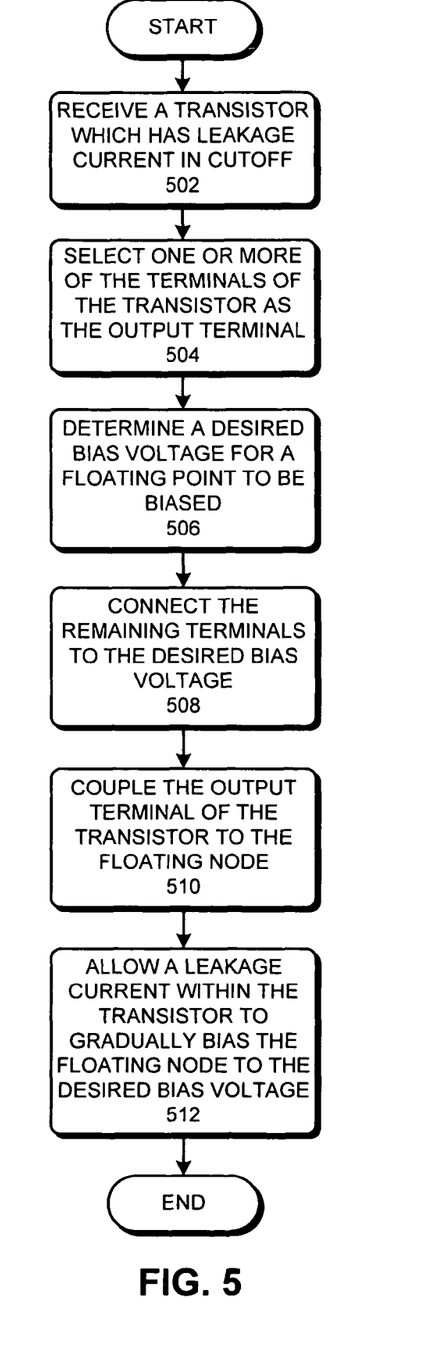
FIG. 5 presents a flowchart illustrating the process of biasing a floating node using a low-power bias source in accordance with an embodiment of the present invention.

FIG. 5 presents a flowchart illustrating the process of biasing a floating node using a low-power bias source in accordance with an embodiment of the present invention.

The system first receives a transistor, wherein the transistor carries a leakage current when it is being biased in a cutoff mode (step 502). The system then selects one or more of the terminals of the transistor as the output terminal (step 504). Note that the selected terminals can be the drain, source, gate, or body.

Next, the system determines a desired bias voltage for the floating node using one of the techniques described above (step 506). The system then connects the remaining terminals to the desired bias voltage (step 508).

The system next couples the output terminal (which can include one to three selected transistor terminals tied together) of the transistor to the floating node (step 510). By coupling the output terminal to the floating node, the system allows a leakage current within the transistor to gradually bias the floating node to the desired bias voltage, wherein the leakage current is between the selected terminal/terminals and the remaining unselected terminals (step 512).

Apparatus for Biasing a Floating Node

Figure 6:
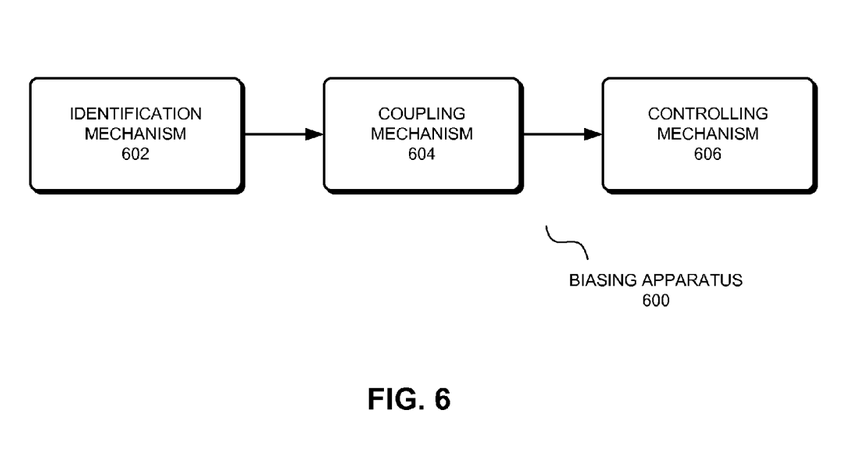
FIG. 6 illustrates an apparatus for biasing a floating node using a low-power bias source in accordance with an embodiment of the present invention.

FIG. 6 illustrates a biasing apparatus 600 for biasing a floating node using a low-power bias source in accordance with an embodiment of the present invention. Biasing apparatus 600 includes identification mechanism 602, coupling mechanism 604, and controlling mechanism 606.

Identification mechanism 602 is configured to identify the floating node within the integrated circuit to be biased.

Coupling mechanism 604 is configured to select one or more terminals of a four-terminal NMOS or PMOS biasing transistor as the output terminal of the biasing transistor. Also, coupling mechanism 602 is configured to connect the remaining unselected terminals to a desired bias voltage, and to couple the output terminal of the biasing transistor to the floating node. Coupling mechanism 602 allows a leakage current between the selected terminals and the unselected terminals of the biasing transistor to gradually bias the floating node to the desired bias voltage.

Controlling mechanism 606 is configured to control a time constant associated with gradually biasing the floating node to the desired bias voltage by changing the sizing of the transistor.

CONCLUSION

The present invention provides a simple biasing technique which uses a single transistor and does not require complicated support circuitry or control signals. Furthermore, the biasing technique consumes very little power because it uses a leakage current from an transistor in CUTOFF mode, which can be orders of magnitude less than a normal conducting current. This "leaky transistor" biasing technique essentially creates an extremely high resistance, non-linear resistor with a small device consuming an insignificant amount of power. The trade-off is that the time constant of the leakage can be orders of magnitude longer than a typical gate delay, resulting in a longer bias setup time. However, once the bias is set up, the set point has properties of self-correction and self-maintenance to the desired voltage, without the need for periodic refreshing.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for configuring an integrated circuit to enable biasing a floating node within the integrated circuit without stopping data transmission through the floating node during biasing, the method comprising:
while manufacturing the integrated circuit:
identifying the floating node within the integrated circuit to be biased;
selecting one or more terminals of a four-terminal NMOS or PMOS biasing transistor as an output terminal of the transistor;
connecting the remaining unselected terminals to a desired bias voltage;
coupling the output terminal of the biasing transistor to the floating node; and
controlling a time constant associated with gradually biasing the floating node to the desired bias voltage by changing the sizing of the biasing transistor.

2. The method of claim 1, wherein the selected terminals can be:
the drain of the transistor;
the source of the transistor;
the gate of the transistor; or
the body of the transistor.

3. The method of claim 1, wherein the leakage current can be:
a drain-source leakage current;
a gate leakage current; or
a body leakage current.

4. The method of claim 1, wherein the floating node can include:
a capacitive node; or
an inductive node.

5. The method of claim 1, further comprising allowing a leakage current between the selected terminals and the unselected terminals of the biasing transistor to gradually bias the floating node to the desired bias voltage during operation of the integrated circuit.

6. An apparatus that configures an integrated circuit during manufacturing to enable biasing a floating node within the integrated circuit without stopping data transmission through the floating node during biasing, the apparatus comprising:
an identification mechanism configured to identify the floating node within the integrated circuit to be biased;
a coupling mechanism configured to:
select one or more terminals of a four-terminal NMOS or PMOS biasing transistor as an output terminal of the biasing transistor;
connect the remaining unselected terminals to a desired bias voltage; and to
couple the output terminal of the biasing transistor to the floating node a controlling mechanism configured to control a time constant associated with gradually biasing the floating node to the desired bias voltage by changing the sizing of the biasing transistor.

7. The apparatus of claim 6, wherein the selected terminals can be:
- the drain of the transistor;
- the source of the transistor;
- the gate of the transistor; or
- the body of the transistor.

8. The apparatus of claim 6, wherein the leakage current can be:
- a drain-source leakage current;
- a gate leakage current; or
- a body leakage current.

9. The apparatus of claim 6, wherein the floating node can include:
- a capacitive node; or
- an inductive node.

* * * * *